United States Patent [19]

Ciszek et al.

[11] 4,243,471
[45] Jan. 6, 1981

[54] METHOD FOR DIRECTIONAL SOLIDIFICATION OF SILICON

[75] Inventors: Theodore F. Ciszek, Salt Point; Guenter H. Schwuttke, Poughkeepsie, both of N.Y.

[73] Assignee: International Business Machines Corporation, Armonk, N.Y.

[21] Appl. No.: 902,206

[22] Filed: May 2, 1978

[51] Int. Cl.³ .............................................. C30B 11/02
[52] U.S. Cl. ........................ 156/616 R; 156/DIG. 83
[58] Field of Search ................... 156/616 R, DIG. 83, 156/DIG. 64; 164/60

[56] References Cited

PUBLICATIONS

Solid–State Electronics, Pergaman Press, vol. 6, pp. 251-254, Lewis et al., 1963.

*Primary Examiner*—Hiram H. Bernstein
*Attorney, Agent, or Firm*—George O. Saile

[57] ABSTRACT

A method for growing silicon crystalline material by the directional solidification method without cracking the growth container. The container material must have an average thermal expansion coefficient of between about 3.0 to $4.3 \times 10^{-6}$°C.$^{-1}$ between about 20° and 650° C. The molten silicon is provided in the container and solidified sequentially from the enclosed regions to the open region of the container to form the crack-free silicon crystalline material.

7 Claims, 3 Drawing Figures

METHOD FOR DIRECTIONAL SOLIDIFICATION OF SILICON

TECHNICAL FIELD

This invention relates to the growth of silicon crystals and more particularly to a method for directional solidification of silicon using a container which allows directional solidification without cracking of the silicon.

BACKGROUND ART

Crystal growth from a melt contained in a crucible is one of the oldest established methods of crystal growth. The basic requirements of the method are very simple, but the presence of the crucible presents manufacturing difficulties which are not easily overcome. The process of growth through solidification of a melt can be divided into two classes based upon whether the crucible containing the melt moves relative to the temperature gradient or the temperature gradient is moved through a stationery crucible containing the melt. A large number of different metals and alkali halides crystals have been formed by these methods. Semiconductor materials such as germanium and galium arsenide crystals have been formed by this method. The details of such methods may be found in S. L. Zerfos, et al, "Crystal Growth at High Temperatures", Transaction Faraday Society, 1949, and J. C. Brice, "The Growth of Crystal from the Melt", published by John Wiley & Sons, Inc., New York, 1965, pages 121 through 134.

As indicated, many materials have been successfully grown in the directional solidification method. However, silicon has been a material that has presented great difficulty in growing crystals by this method. The primary problem with silicon is the cracking of the crucible or container walls upon reduction of the material to room temperature. Publications indicating this fact that silicon has not been successfully grown by this simple process are the W. R. Runyan "Silicon Semiconductor Technology" published by McGraw Hill Book Company, New York, 1965, and the W. R. Runyan, et al, U.S. Pat. No. 3,093,456.

B. Authier, "Novel Silicon Crystals and Method for Their Preparation", German Pat. No. P2508803.3-43, Sept. 9, 1976, is directed to an invention to form silicon by a casting and solidification technique to overcome the cracking problems of the prior art. This process involves pouring a silicon melt into a suitable mold, allowing the melt to solidify in a temperature gradient, which process is characterized be the fact that after the silicon melt is poured into the suitably shaped mold at least one of the two mutually opposing boundary surfaces of the melt is in contact with one surface of the mold and one surface in contact with the melt has a temperature of at most 1200° C. The opposite boundary surface of the melt is subjected to a temperature at least 200 to 1000° greater, but below the melting point of silicon. The purpose of the temperature gradient is to avoid the wetting of the crucible with the silicon and thereby preventing thermal strains when the material is cooled to room temperature.

It is also known that graphite is a durable substrate in contact with liquid silicon provided that the density of the graphite is greater than about 1.75 grams per cubic centimeter and the grain size is less than about 50 microns as indicated in T. F. Ciszek's Materials Research Bulletin No. 7, pages 731 through 738, 1972. The degree of carbon contamination of the silicon is small in the order of 20 parts per million, and similar to the level of oxygen contamination when silicon is grown from conventional silicon dioxide crucibles. However, unlike oxygen, carbon is not electrically active in silicon.

A portion of the present invention is disclosed in "Silicon Ribbon Growth by a Capillary Action Shaping Technique", by G. H. Schwuttke, et al., Annual Report, Oct. 1, 1977, JPL Contract: 954144, Subcontract under NASA Contract NAS7-100, pages 5-13.

SUMMARY OF THE PRESENT INVENTION

According to the present invention there is described a method for growing silicon crystals by directional solidification without the formation thermal strains in the crystal that caused cracking of the crystal. Below the temperature of about 650° C. silicon responds to an applied stress by deforming elastically until fracture stress or cracking is reached. Silicon will under normal conditions adhere to the conventional crucibles materials, such as glass, quartz or carbon, and the result is cracking when the silicon fracture stress is exceeded. The method for growing silicon crystalline material that overcomes this problem involves providing molten silicon in a carbon container. The container has an average thermal expansion coefficient of between about 3.0 to $4.3 \times 10^{-6}$°C.$^{-1}$ between 20° and 650° C. Solidification of the molten silicon is sequentially accomplished from the enclosed regions to the open region of the container to form the crack free silicon crystal.

DISCLOSURE OF THE INVENTION

Figure 1:
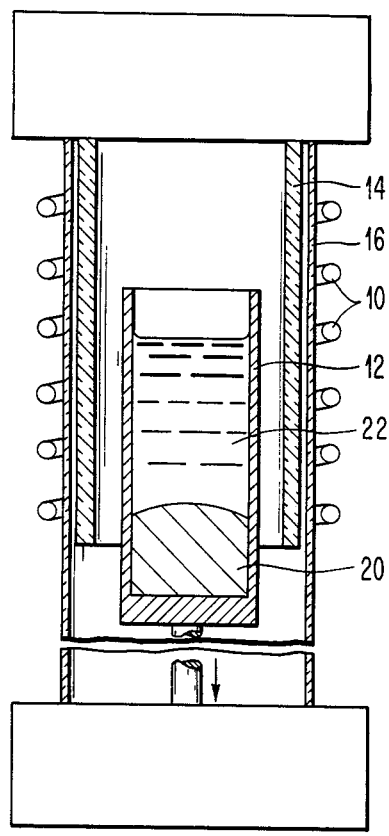
FIG. 1 Illustrates an apparatus for the crystal growth through solidification of silicon in a carbon crucible.

Silicon is capable of plastic deformation from the melting point of about 1415° C. down to about 650° C. Below that temperature, silicon responds to an applied stress by deforming elastically until the fracture stress or cracking is reached. In the temperature range of 650° to 20° C., the thermal expansion coefficient of silicon monotonically decreases from $5 \times 10^{-}$°C.$^{-1}$ to $2.4 \times 10^{-6}$°C.$^{-1}$ almost linearly. When silicon is solidified and then cooled below about 650° C. in common crystal crucible materials, such as quartz, the silicon shrinks at a much higher rate than the crucible. The thermal expansion coefficient of fused quartz is $0.55 \times 10^{-6}$°C.$^{-1}$ in a temperature range of between 15° to 1000° C. Cracking results as the silicon fracture stress is exceeded since silicon would adhere to quartz or similar materials.

It has been discovered that certain carbon containers can be used in the directional solidification method where the container is within the critical average thermal coefficient range of between about 3.0 to $4.3 \times 10^{-6}$°C.$^{-1}$ between 20° and 650° C. It is important in this case of graphite materials having the temperature thermal coefficient of expansion range, to also have a density of less than about 1.8 grams per cubic centimeter and a maximum grain size of less than about 50 microns. This is important because otherwise silicon will infiltrate the porous graphite structure causing swelling and cracking of the walls.

The container can be formed in any desired cross-sectional shape, such as square or rectangular. The container can be formed with a conical bottom recess for a seed to be placed therein.

The resulting crystal may be sliced with the carbon container still intact. The carbon can be removed at any time simply by oxidizing it.

In the method using a stationary crucible and lowering of temperature of the melt, it is preferred to lower the temperature at a rate of between about 0.1 and 100° C. per minute. Below the 0.1° C. per minute it is too slow to be economically useful and above about 100° C. per minute latent heat of fusion cannot be dissipated quickly enough which causes non-uniform solidification which in turn results in cracking of the crystalline material. The following examples are included merely to aid in the understanding of the invention and variations may be made by one skilled in the art without departing from the spirit scope of the invention.

EXAMPLE 1

A 139 gram polycrystalline charge of silicon was placed in a 50 mm diameter×50 mm high vitreous carbon crucible along with sufficient boron to produce a 2 ohm-cm average resistivity. The vitreous carbon used had a theraml expansion coefficient between 3.2 to $3.5 \times 10^{-6}$°C.$^{-1}$ in the range of 100 to 600°C., the density was 1.55 grams per cubic centimeter, and the porosity was impervious to molten silicon. Graphite r-f susceptors and heat shields were arranged to establish a vertically-increasing temperature gradient of about 35° C./cm, the top of the crucible being the hottest region. The system first was heated to melt the silicon and then additionally heated to a temperature of 1680° C. (at the top melt surface). Since the melt was about 3 cm deep, the temperature at the bottom of the crucible was approximately 1575° C. The molten silicon was held at this temperature for 15 minutes. The system temperature was then decreased at a rate of 2.5° C./min. (while maintaining the vertical gradient) until the entire charge had solidified (about 2 hours). The cooling rate was then increased to 20° C./min. until the silicon temperature was 1000° C., at which time the power was turned off. The growth system was very clear during this experiment.

Upon removal from the furnace, the solidified silicon was found to be intact and free of cracks. Several thin slices were sawed from the bottom and top of the cylindrical ingot. Small silicon carbide particles were found at the carbon/silicon interface on the crucible bottom.

At a distance of 0.7 mm from the crucible bottom, silicon grain size ranged from 0.05 mm to 2 mm, with 0.5 mm being a typical size. The silicon here was P-type, and resistivities ranged from 1.4–5.0 ohm-cm.

At a distance of 2.5 cm from the crucible bottom, the grains were substantially larger. They ranged up to 4 mm in size, with 1 mm being a typical size. There is a substantial amount of vertical boundary behavior. Many of the grains are visible from both sides of a 1.2 mm thick slice. The resistivity here ranged from 0.5–2.1 ohm-cm, P-type.

Since the grains are large and at least some of the boundaries are vertical, these wafers would make acceptable solar cells.

EXAMPLE 2

Figure 2:
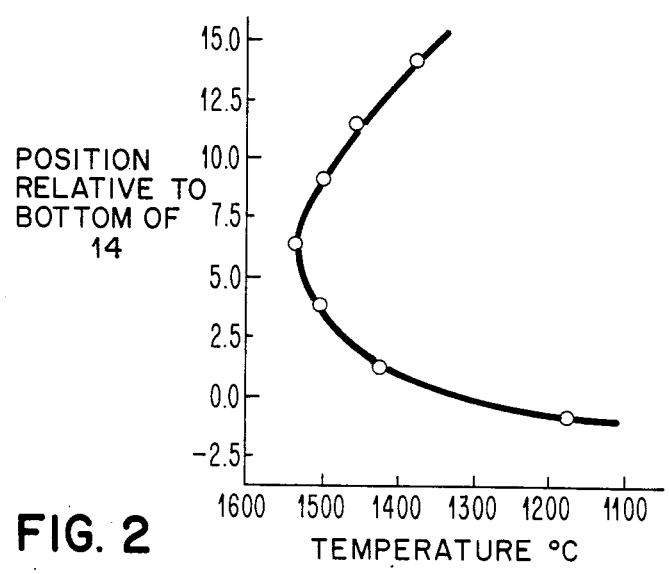
FIG. 2 Shows a temperature distribution curve for the solidification of silicon in the FIG. 1 apparatus.

A graphite crucible of 5 cm×5 cm×12 cm high was made of Union Carbide CMB graphite which had a thermal expansion coefficient of 5 to $3.2 \times 10^{-6}$°C.$^{-1}$ in the range of 800° to 200° C., a density of 1.76 to 1.78 grams per cubic centimeter and maximum grain size of about 75 microns. A silicon charge of 484 grams was placed in this crucible. the crucible was positioned in a fixed RF-coil heater 10 shown in FIG. 1. The charge was heated above the melting temperature of silicon in the crucible 12 to a temperature of about 1430° to 1580° C. Surrounding the crucible 12 was an insulator 14. The furnace shell 16 was formed of fused quartz. When the silicon is molten and uniform, the solidification process using the FIG. 1 apparatus was accomplished by lowering the crucible in the direction of the arrow and out of the RF-coil 10 region at a rate of 5.5 mm/minute. The FIG. 1 shows a region of solid silicon 20 and molten silicon 22. The furnace's vertical temperature profile during the solidification process is shown in FIG. 2.

The equilibrium grain structure was initiated by nucleation at the crucible walls, with surviving grains tending to grow in alignment with the crucible axis to produce an axially columnar grain structure. The grain size was about the same as in Example 1, and the ingot again was free of cracks. The wafers would make acceptable solar cells.

EXAMPLE 3

A graphite crucible was formed in a cylindrical shape of 6 cm diameter by 6.5 cm high using Ultra-Carbon UF-4S graphite having a thermal expansion coefficient of 1.8 to $2.9 \times 10^{-6}$°C.$^{-1}$ between 0 and 600° C., density of 1.79 grams per cubic centimeter, maximum grain size of about 200 microns and porosity of 24 percent. A charge of silicon was placed in the crucible was described in Example 2, and the process performed as described in the Example 2 above. The crucible cracked during solidification.

Figure 3:
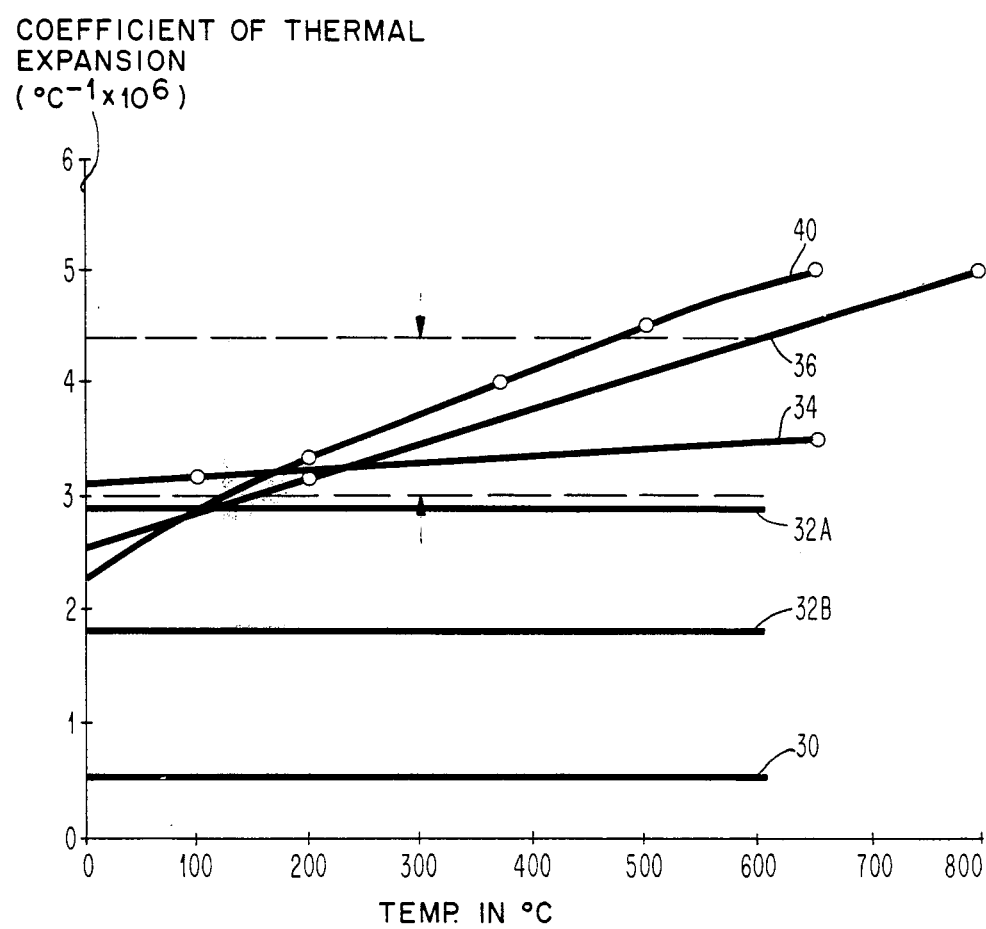
FIG. 3 Shows the thermal expansion coefficient as a function of temperature for silicon using various containers.

The graphite crucible had the required density but too low a thermal expansion coefficient and too large a grain size. It failed by silicon absorption into the graphite, with subsequent swelling and multiple crack formation in the crucible walls. The cracking and resultant leakage allowed silicon to escape from the crucible into the space between the crucible 12 and opaque quartz insulator tube 14. In FIG. 3, the coefficient of thermal expansion is plotted versus the temperature in centigrade for the materials which were used as crucibles in the examples as well as for silicon 40 and fused quartz 30. Quartz 30 and UF-4S graphite (32A against grain and 32B with the grain) fail by cracking when used as crucibles. CMB graphite 36 and vitreous carbon 34 produced crack-free ingots. Ideally, the thermal expansion coefficient of the crucible should exactly match that of silicon below the silicon plastic deformation temperature (approximately 650° C.), so that the dimensional changes of the crucible and the silicon are identical during cool-down. The CMB graphite most nearly approached this ideal. In the case of vitreous carbon, the crucible initially (at 650° C.) shrinks less rapidly than the silicon, but near room temperature it shrinks more rapidly. Its average coefficient of thermal expansion in the critical temperature range (650° C.–20° C.) is about $3.3 \times 10^{-6}$°C.$^{-1}$. It has been found that the acceptable range of average coefficients of thermal expansion to produce vcrack-free silicon ingots is between about 3.0 to $4.3 \times 10^{-6} °C.^{-1}$.

While we have illustrated and described the preferred embodiments of our invention, it is to be understood that I do not limit myself to the precise constructions herein disclosed and the right is reserved to all changes and modifications coming within the scope of the invention as defined in the appended claims.

Having thus described our invention, what we claim as new and desire to secure by Letters Patent is:

1. Method for growing silicon crystal comprising:
   providing molten silicon in a graphite container;
   said container having an average thermal expansion coefficient of between about 3.0 to $4.3 \times 10^{6} °C.^{-1}$ between 20° and 650° C., density of about 1.8 grams per cubic centimeter and grain size of less than about 50 microns; and
   solidifying said molten silicon sequentially from the enclosed regions to the open region of said container to form crack-free silicon crystal.

2. The method of claim 1 wherein said container is a crucible and solidification is accomplished by lowering the system temperature at a rate of about 0.1 to 100° C. per minute.

3. The method of claim 1 wherein said container is a crucible and solidification is accomplished by removing said crucible from an RF heater to effect said sequential cooling.

4. The method of claim 1 wherein a silicon seed is positioned in said container to act as nucleation for growth of silicon crystal during said solidifying of said molten silicon.

5. The method of claim 4 wherein said container has a conical recess for said seed crystal to be positioned.

6. The method of claim 1 wherein the said carbon container has a subsequentially square cross-section.

7. Method for growing silicon crystal comprising:
   providing molten silicon in a vitreous carbon container;
   said container having an average thermal expansion coefficient of between about 3.0 to $4.3 \times 10^{6} °C.^{-1}$ between 20° C. and 650° C., density of about 1.5 grams per cubic centimeter and grain size of less than about 50 microns; and
   solidifying said molten silicon sequentially from the enclosed regions to the open region of said container to form crack-free silicon crystal.

* * * * *